United States Patent

Caldwell et al.

Patent Number: 5,867,111
Date of Patent: Feb. 2, 1999

[54] TOUCH CONTROL SYSTEM

[75] Inventors: David W. Caldwell; Nicholas W. Medendorp, both of Holland, Mich.

[73] Assignee: Donnelly Technology, Inc., Holland, Mich.

[21] Appl. No.: 740,701

[22] Filed: Nov. 1, 1996

Related U.S. Application Data

[63] Continuation of Ser. No. 040,188, Mar. 29, 1993, Pat. No. 5,572,205.

[51] Int. Cl.$^6$ .................................................. H03M 11/00
[52] U.S. Cl. ............................... 341/33; 341/20; 200/600
[58] Field of Search ........................... 341/33, 26, 72, 341/24, 195; 200/600, 5 A; 345/168, 173; 219/451; 362/32

[56] References Cited

U.S. PATENT DOCUMENTS

| | | | |
|---|---|---|---|
| 3,846,791 | 11/1974 | Foster | 341/33 |
| 3,971,013 | 7/1976 | Challoner et al. | 345/174 |
| 3,974,472 | 8/1976 | Gould, Jr. . | |
| 4,056,699 | 11/1977 | Jordan . | |
| 4,090,092 | 5/1978 | Serrano . | |
| 4,119,864 | 10/1978 | Petrizio . | |
| 4,123,631 | 10/1978 | Lewis . | |
| 4,136,291 | 1/1979 | Waldron . | |
| 4,145,748 | 3/1979 | Eichelberger et al. | 341/33 |
| 4,159,473 | 6/1979 | Senk . | |
| 4,161,766 | 7/1979 | Castleberry et al. . | |
| 4,175,239 | 11/1979 | Sandler | 341/33 |
| 4,203,230 | 5/1980 | Ziegler et al. | 200/600 |
| 4,211,915 | 7/1980 | Miller et al. | 341/33 |
| 4,237,421 | 12/1980 | Waldron | 341/33 |
| 4,246,533 | 1/1981 | Chiang . | |
| 4,263,659 | 4/1981 | Hirata et al. . | |
| 4,290,052 | 9/1981 | Eichelberger et al. . | |
| 4,291,303 | 9/1981 | Cutler et al. | 341/33 |
| 4,304,976 | 12/1981 | Gottbreht . | |
| 4,308,443 | 12/1981 | Tucker et al. | 341/22 |
| 4,323,829 | 4/1982 | Witney et al. . | |
| 4,380,040 | 4/1983 | Posset . | |
| 4,388,612 | 6/1983 | Takagi | 341/145 |
| 4,394,643 | 7/1983 | Williams . | |
| 4,400,758 | 8/1983 | Frame . | |
| 4,405,917 | 9/1983 | Chai | 341/26 |
| 4,405,918 | 9/1983 | Wall et al. | 341/26 |
| 4,413,252 | 11/1983 | Tyler et al. | 341/33 |
| 4,439,647 | 3/1984 | Calandrello et al. . | |
| 4,446,350 | 5/1984 | Mizukawa et al. | 219/622 |
| 4,495,485 | 1/1985 | Smith . | |
| 4,527,049 | 7/1985 | Thomas et al. | 219/449 |
| 4,529,968 | 7/1985 | Hilsum et al. | 200/600 |
| 4,550,310 | 10/1985 | Yamaguchi et al. . | |
| 4,561,002 | 12/1985 | Chiu et al. . | |
| 4,567,470 | 1/1986 | Yoshikawa et al. . | |
| 4,614,937 | 9/1986 | Poujois . | |
| 4,651,133 | 3/1987 | Ganesan et al. . | |

(List continued on next page.)

*Primary Examiner*—Jeffery Hofsass
*Assistant Examiner*—Albert K. Wong
*Attorney, Agent, or Firm*—Van Dyke, Gardner, Linn & Burkhart, LLP

[57] ABSTRACT

A touch control system that is responsive to a user input selection includes an electrically non-conducting substrate, such as glass ceramic, and at least one capacitive-responsive touch pad on the substrate. A source signal having a primary frequency that is greater than 150 kHz, and preferably in the range of between 150 kHz and 500 kHz, is applied to one portion of the touch pad. The touch pad couples the electrical signal to another portion of the touch pad in order to develop a detection signal, which is decoded in order to determine the presence of the capacitance of a user. The decoder preferably includes a peak detector composed of a low gain circuit in order to avoid distortion of the detection signal. Greatly improved performance in the presence of liquids, such as water, on the touch pad is provided. This is especially useful when the touch pad is applied to a horizontal surface, such as a cook top, upon which liquid spills may occur. A display is juxtaposed with the glass ceramic substrate and an optical correction material is provided between the display and the underlying modulated surface that imparts mechanical strength to the substrate. The optical correction material corrects optical distortion of the visual indications of the display caused by the modulated surface.

30 Claims, 4 Drawing Sheets

U.S. PATENT DOCUMENTS

| | | | |
|---|---|---|---|
| 4,665,324 | 5/1987 | Ogino et al. ............................. | 200/600 |
| 4,688,018 | 8/1987 | Vaughn .................................... | 341/136 |
| 4,709,228 | 11/1987 | Hucking et al. ......................... | 341/26 |
| 4,712,163 | 12/1987 | Oxley ....................................... | 362/29 |
| 4,731,694 | 3/1988 | Grabner et al. . | |
| 4,736,190 | 4/1988 | Fiorella . | |
| 4,740,781 | 4/1988 | Brown . | |
| 4,743,895 | 5/1988 | Alexander . | |
| 4,777,470 | 10/1988 | Naylor ..................................... | 341/163 |
| 4,794,233 | 12/1988 | Goessler et al. ........................ | 219/464 |
| 4,855,550 | 8/1989 | Schultz, Jr. ............................. | 700/600 |
| 4,894,493 | 1/1990 | Smith et al. ............................ | 200/5 A |
| 4,901,074 | 2/1990 | Sinn et al. ............................... | 341/22 |
| 4,914,553 | 4/1990 | Hamada et al. ......................... | 362/32 |
| 4,920,343 | 4/1990 | Schwartz .................................. | 341/33 |
| 4,924,222 | 5/1990 | Antikidis et al. ........................ | 341/33 |
| 4,954,823 | 9/1990 | Binstead .................................. | 341/33 |
| 4,983,812 | 1/1991 | Worrall et al. .......................... | 219/451 |
| 5,012,124 | 4/1991 | Hollaway ................................. | 341/33 |
| 5,049,882 | 9/1991 | Gorecki ................................... | 341/143 |
| 5,153,572 | 10/1992 | Caldwell et al. ........................ | 341/24 |
| 5,155,338 | 10/1992 | Hoffmann ................................ | 219/451 |
| 5,157,273 | 10/1992 | Medendorp et al. .................... | 307/147 |
| 5,183,996 | 2/1993 | Hazan et al. ............................. | 219/452 |
| 5,189,417 | 2/1993 | Caldwell et al. ........................ | 341/26 |
| 5,239,152 | 8/1993 | Caldwell et al. . | |
| 5,270,710 | 12/1993 | Gaultier et al. . | |

TOUCH CONTROL SYSTEM

RELATED APPLICATION

This application is a continuation of application Ser. No. 08/040,188 filed on Mar. 29, 1993, now U.S. Pat. No. 5,572,205.

BACKGROUND OF THE INVENTION

This invention relates generally to touch control systems and, more particularly, to capacitance-responsive touch control input devices for application to horizontal substrates, such as glass ceramic panels. The invention is particularly adapted for use with smooth-top induction, radiant, and halogen burner cooking appliances.

Touch control input devices that respond to the capacitance of a user's contact in order to actuate an appliance are typically applied to a vertical surface. While such orientation is primarily for the convenience of use, it avoids several problems associated with applying touch controls to horizontal surfaces, such as smooth-top cooking appliances. One difficulty with application to horizontal substrates is that there is a greater likelihood that liquids will be splashed on the touch control applied to a horizontal surface, such as a range cook top. Such moisture tends to cause erratic operation of the input control, which could be dangerous in the case of a cooking appliance. This difficulty is typically overcome by separating the touch control from the cooking surface in order to provide a physical barrier between the two. This solution is not without its drawbacks. The primary benefit of a smooth-top cooking appliance is to eliminate the difficulty of cleaning up from spills and boil-over getting into burner elements. While separate touch control input devices are an improvement over electromechanical controls, which still allow places where spills can accumulate, the requirement for a physical barrier between the cook top and the touch control is an impediment to easy cleanup and is a compromise in aesthetic appearance.

An attempt to overcome the problem caused by watery spills on the support surface of a smooth-top cooking appliance causing erroneous operation of a touch control applied directly to the support surface is disclosed in U.S. Pat. No. 4,446,350 issued to Takumi Mizukawa et al. for an INDUCTION HEATING COOKING APPARATUS. In Mizukawa et al., touch pads are provided on the upper surface of a pan supporting plate and are enclosed by guard rings of conductive material composed of a grounded conductor and an enclosing conductor. A control circuit, which is responsive to the touch pads and the guard rings, responds to spilled water or the like contacting the guard rings by latching a power control circuit at a zero power level. This resets the cooking apparatus to a zero heat output condition. The solution proposed in Mizukawa et al. has several difficulties. At least one of the guard rings must be connected with a ground potential in order to be effective. This requires conductive leads being applied to the pan support surface, which is costly and a potential source of failure. Additionally, Mizukawa et al. responds to spilled water by latching the cooking apparatus into a zero output condition. This is a nuisance to the user by requiring that the spill be wiped up and the power level of the cooking apparatus reset in order to continue with the cooking operation.

Another difficulty with applying a touch control to a horizontal substrate is that code requirements, as well as conservative engineering practices, dictate that large horizontal panels be manufactured using particular materials and in a particular manner to avoid breakage due to either mechanical impact or thermal shock. In particular, while relatively thin soda-lime glass may be utilized for vertical touch panels, smooth-top cooking surfaces that are capable of supporting multiple pans above multiple burners are made from glass ceramic material having a greater thickness, on the order of three (3) to five (5) millimeters and require negligible thermal expansion. Additionally, the surface of the substrate facing away from the user is modulated, or dimpled, in order to add greater mechanical strength to the substrate. The thickness of the glass ceramic material and the modulated surface have prevented, in the past, application of touch control technology to such large horizontal substrates.

SUMMARY OF THE INVENTION

The present invention is embodied in a touch control that is responsive to a user input selection. The control includes an electrically non-conducting substrate and a capacitance-responsive touch pad on the substrate. A signal generator is provided as a source to generate an electrical signal and to apply the signal to one portion of the touch pad. The touch pad couples the electrical signal to another portion of the touch pad in order to develop a detection signal. The touch pad responds to the presence of capacitance of a user in order to selectively attenuate the detection signal. A decoding circuit responds to the detection signal in order to determine the presence of the capacitance of a user.

According to one aspect of the invention, a source signal generator is provided that generates a high frequency electrical signal having a primary frequency that is greater than 150 kHz and preferably in the range of between 150 kHz and 500 kHz. Such high frequency electrical signal may be a square wave, a triangular wave, a sawtooth wave, a sinusoidal wave or some other waveform. This aspect of the invention is based upon the discovery that touch controls operated at such primary frequencies have improved water immunity performance. According to another aspect of the invention, the decoding circuit may include a peak detector that is coupled directly with the detection signal, in order to produce an output, and a switch circuit that is responsive to the output of the peak detector in order to determine an amplitude of the output indicative of attenuation of the source electrical signal. The peak detector is preferably a low gain circuit in order to avoid distorting the detection signal by exceeding the gain/bandwidth product of the circuit and in order to avoid fast signal slew rates. The switch circuit is preferably coupled to the output of the peak detector by an amplifier circuit. In this manner, amplification is performed on the lower frequency signal of the peak detector output rather than on the higher frequency of the detection signal. The gain/bandwidth product of the system is not exceeded at any point in order to provide a more accurate detection of the effect of a user contacting a touch pad and low slew-rate components may be used to embody the invention.

According to another aspect of the invention, a touch control is provided for a glass ceramic substrate having a user contact surface and an opposite modulated surface. A keypad is defined by a plurality of touch pads, each of the touch pads having a pair of electrically conductive elements affixed to the modulated surface. A signal generator is provided that is adapted to generate an electrical signal and to apply the signal to one of the electrically conductive elements of at least one of the touch pads. The electrical signal is passively coupled to the other one of the electrically conductive elements in order to develop a detection signal. The touch pads respond to the presence of capacitance of a user in order to selectively attenuate the detection signal. A decoding circuit is provided that responds to the detection circuit in order to determine the presence of capacitance of a user.

According to yet another aspect of the invention, a display is juxtaposed with the substrate modulated surface in order to provide visual indications to a user. An optical correction material is provided between the display and the substrate. The optical correction material corrects optical distortion of the visual indications of the display caused by the modulated surface. In a preferred embodiment, the optical correction material is a transparent adhesive that adheres a flexible carrier carrying the display device and/or the touch pad flexible conductor to the glass substrate.

The present invention overcomes the difficulties of the prior art by providing a touch control that has greatly improved performance in the presence of liquids, such as water, on the touch pads positioned on the user interface surface of the substrate. Because the system's immunity to water is significantly improved, there is no necessity for a specialized guard ring or for latching of the cooking appliance in an off state in the presence of water. Accordingly, the user is not bothered by having to reset the power level of the burner when a liquid spill occurs. The present invention allows, for the first time, a practical application of a touch control to a glass ceramic-substrate having a modulated rear surface. A touch control circuit is provided according to the invention which is capable of accommodating the electrical characteristics of such substrate. In addition, a unique means is provided to correct distortions of the image displayed by a display device and viewed through the dimpled, modulated surface of the substrate.

These and other objects, advantages and features of this invention will become apparent upon review of the following specification in conjunction with the drawings.

DESCRIPTION OF THE PREFERRED EMBODIMENT

Figure 1:
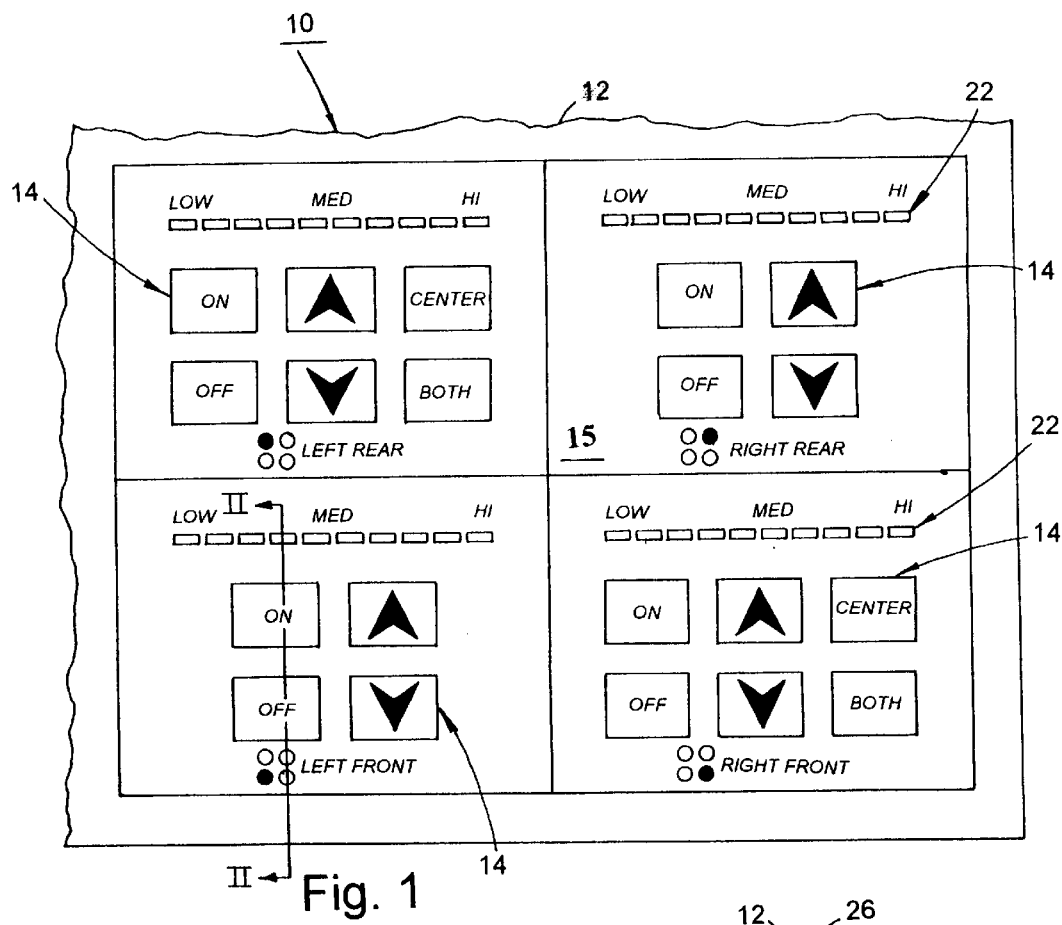
FIG. 1 is a top plan view of a system incorporating a touch control according to the invention.
Figure 2:
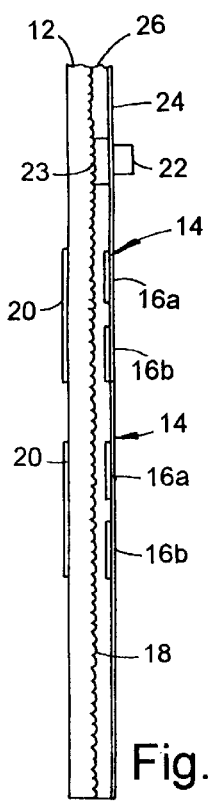
FIG. 2 is a sectional view taken along the lines II—II in FIG. 1.
Figure 3:
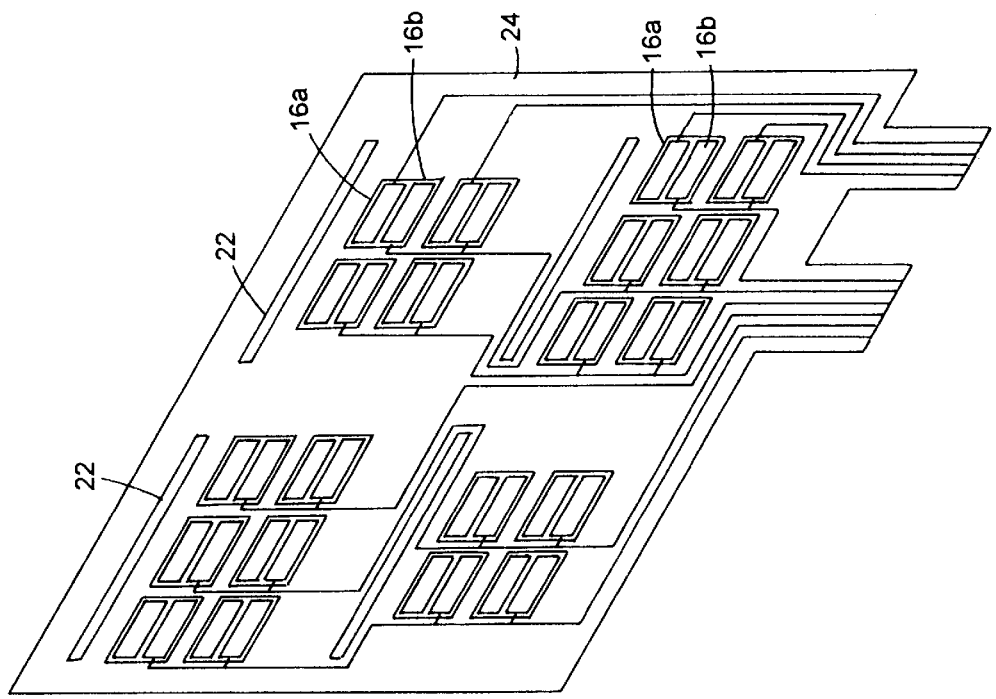
FIG. 3 is an exploded perspective view from the top of the touch control in FIG. 1.
Figure 3:
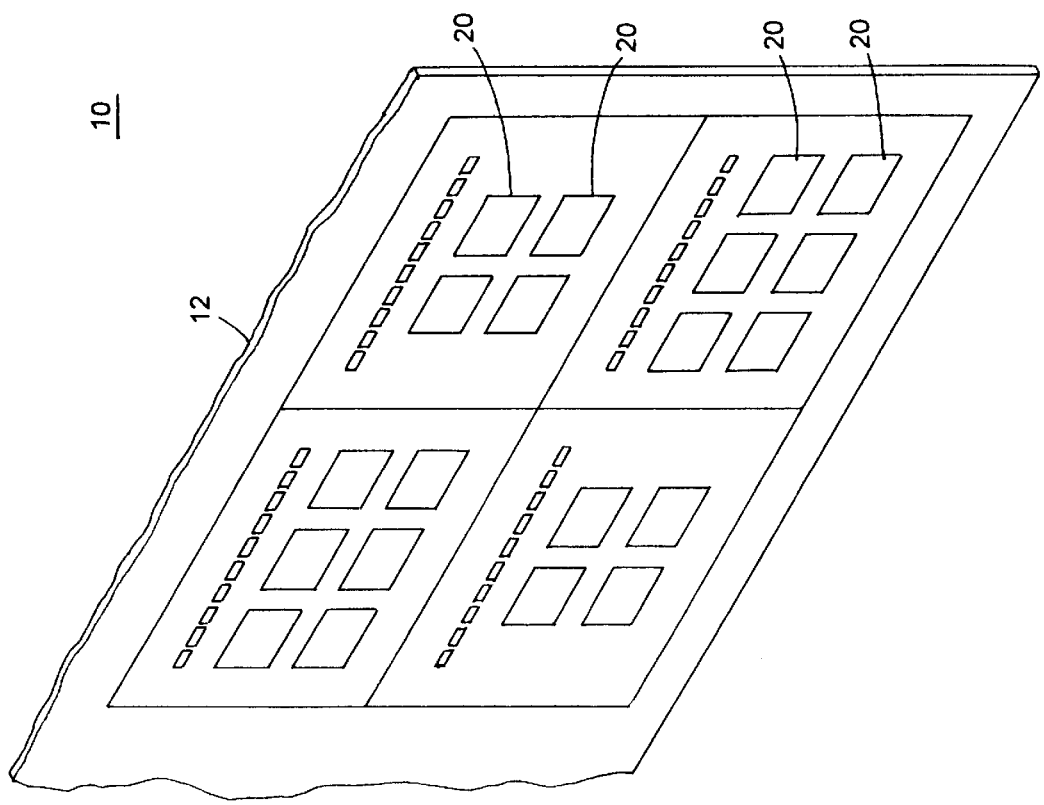
Figure 4:
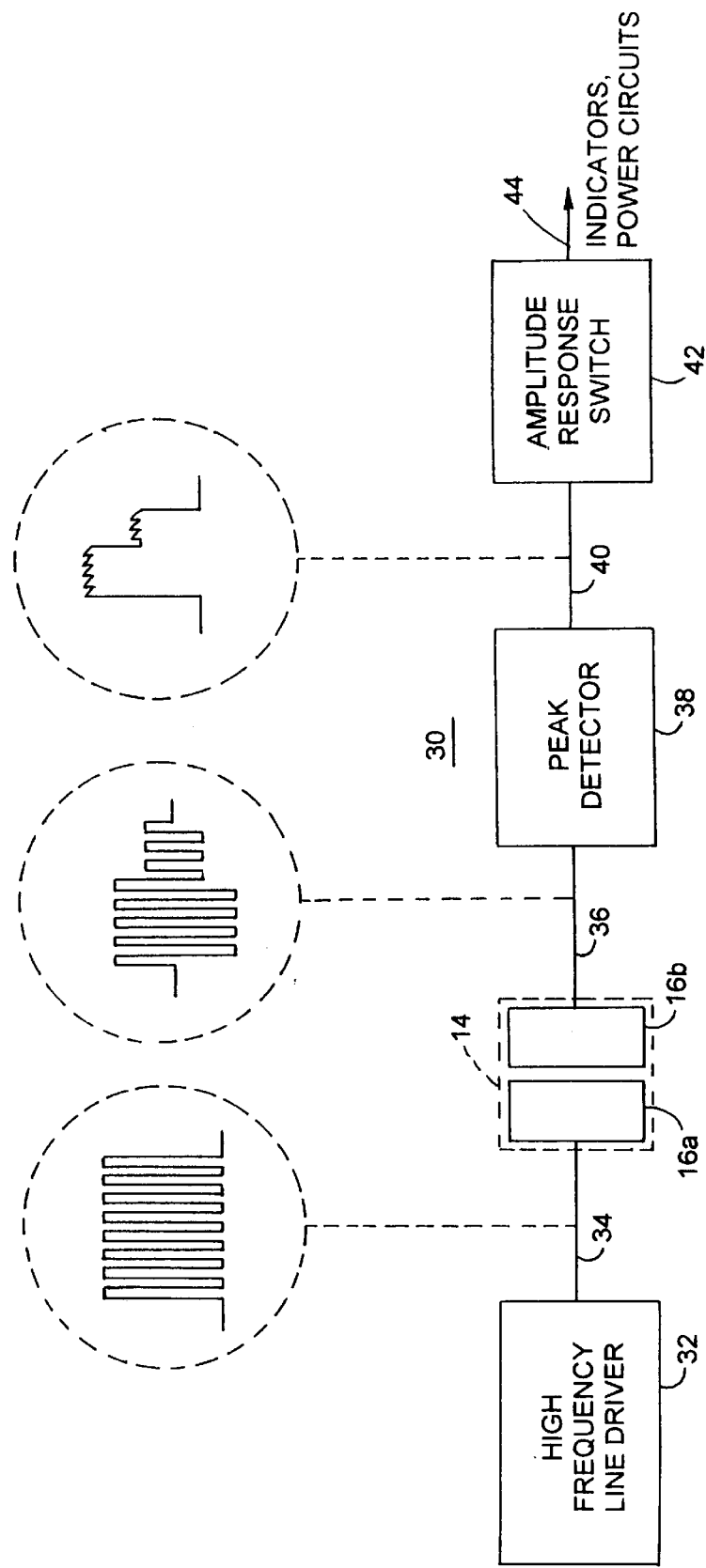
FIG. 4 is a block diagram of a touch control according to the invention.

Referring now specifically to the drawings, and the illustrated embodiment depicted therein, a touch control 10 includes a generally planar substrate 12 and a plurality of touch pads, generally indicated at 14 applied to substrate 12 (FIG. 1). Each touch pad 14 includes a first portion composed of an electrically conducting element 16a and a second portion composed of an electrically conducting element 16b affixed to a surface 18 of substrate 12, which faces away from the user (FIGS. 2–4). Each touch pad 14, in the illustrative embodiment, also includes a user contact pad 20 overlying the conductive elements 16a and 16b. User contact pads 20 are transparent conductive metallic oxide films applied by conventional sputtering or pyrolytic techniques. Touch control 10 may additionally include indicators 22 in order to provide visual indication to the user of the condition of the appliance being controlled (not shown). In the illustrated embodiment, substrate 12 is a glass ceramic member having a thickness in the range of three (3) to five (5) millimeters in order to provide adequate strength for horizontal applications in which mechanical stress may be applied to the substrate. One such application is a smooth-top cooking surface for a 4-burner cooking appliance. In order to further enhance the strength of substrate 12, surface 18 is modulated or dimpled (FIG. 2). Substrate 12 is marketed under the mark "Ceran" by Schott Glass Company located in Yonkers, N.Y.

In order to apply the conductive elements 16a, 16b of each touch pad to surface 18 of substrate 12, the conductive elements 16a, 16b are mounted to a flexible carrier 24. Carrier 24 is adhered to surface 18 by an adhesive layer 26. Additionally, indicators 22 are mounted to flexible carrier 24 in order to locate the indicators in a position where they may be viewed through substrate 12. In order to correct optical distortion created by the presence of the modulations, or dimples, on surface 18, an optical correction material 23 is positioned between indicator 22 and modulated surface 18. Optical correction material 23 has an index of refraction that is compatible with that of substrate 12 and fills in the voids between the dimples of surface 18, as well as the space between surface 18 and indicator 22. In this manner, light emitted by indicator 22 passes through substrate 12 without substantial distortion.

Figure 6:
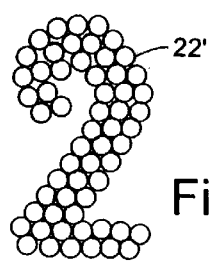
FIG. 6 is an illustration of an optical indicator without an optical correction material.
Figure 7:
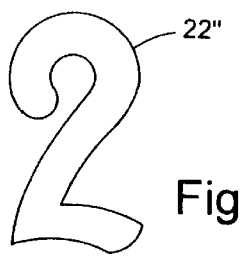
FIG. 7 is an illustration of an optical indicator with an optical correction material according to the invention.

Operation of optical correction material 23 may be understood by comparing an indicator 22' in FIG. 6 with an indicator 22" in FIG. 7. Indicator 22' illustrates the optical effect of modulated surface 18. The different incidence angles of light rays caused by the dimples creates a "fish-eye" effect whereby an initially homogeneous indication takes on the appearance of numerous circles and the indication has serrated edges. In contrast, indicator 22" illustrates the corrective effect of optical correction material 23 in eliminating distortions to the homogeneous appearance of the indicator, including retaining the crisp edges of the initial indication.

Optical correction material, in the illustrated embodiment, is a transparent acrylic material. While optical correction material 23 is clear, it may be also dyed in order to modify the color of indicators 22. A clear acrylic material in transfer adhesive form is commercially available from the 3M Company, Minneapolis, Minn., and marketed under Type 300MP. In a most preferred embodiment, a clear acrylic adhesive, such as 3M Type 300MP, is applied to the entire interface between surface 18 and flexible carrier 24 at a thickness of 0.013 inches in order to affix the flexible carrier to the substrate and to provide optical correction material for indicators 22.

Figure 5:
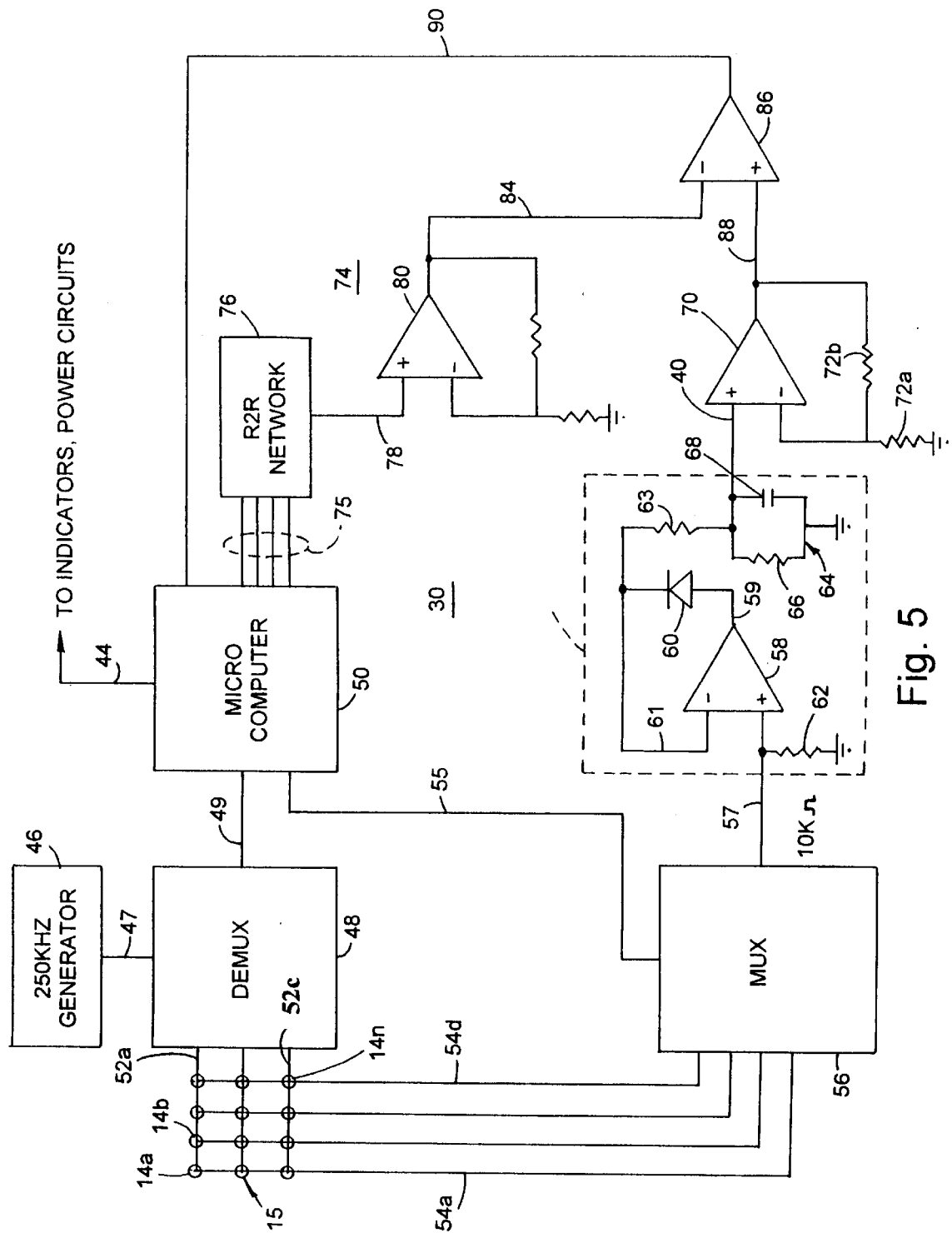
FIG. 5 is an electrical schematic diagram of a touch control according to the invention.

Touch control 10 includes an electronic control 30 having a high frequency line driver 32 as a source for producing a high frequency pulsed signal at 34, which is applied to portion 16a of touch pad 14 (FIGS. 4 and 5). This signal is capacitively coupled to portion 16b of touch pad 14 in order to produce a detection signal at 36. When there is no user contacting the user contact pad 20 associated with touch pad 14, the very high frequency signal at 34 is coupled to detection signal 36 without attenuation by the capacitance of the user's body. This is illustrated as the initial portion (left side) of the waveform illustrated at 36. When, however, a user engages the user contact pad 20 associated with touch pad 14, the detection signal becomes attenuated to a lower amplitude as illustrated in the second portion (right side) of the waveform illustrated at 36 in FIG. 4. In the illustrated embodiment, portion 16a and 16b provide a 10–30 picofarad (pf) coupling between the high frequency signal at 34 and the detection signal at 36. Accordingly, a peak voltage, for example, of between five (5) and twelve (12) volts produced by the high frequency line driver may develop a detection signal at 36 on the order of magnitude of 70 mv.

The detection signal on line 36 is decoded by a peak detector 38, which produces an output 40, and an amplitude-responsive switch 42, which responds to the amplitude of output 40 in order to actuate appropriate indicators, power circuits and the like, as illustrated at 44. High frequency line driver 32 has a primary frequency that is at least equal to 150 kHz. It has been discovered that, for primary frequencies of 150 kHz and above, touch control 10 has increased immunity to cross-coupling between adjacent touch pad 14 due to liquids, such as water, on substrate 12. While it is believed that most frequencies above 150 kHz would provide improved liquid immunity, considerations of component configurations of control system 30 would suggest a practical upper limit of approximately 500 kHz on the primary frequency for line driver 32. In the illustrated embodiment, line driver 32 has a primary frequency of 250 kHz. In the illustrated embodiment, the output signal of high frequency line driver 32 is a square wave varying between zero volts and an upper limit, such as five volts. When coupled through portions 16a and 16b of touch pad 14, the detection signal at 36 is a square wave which oscillates equally at both polarities with respect to signal ground. Alternatively, high frequency line driver 32 could produce other waveforms, such as a triangle, sawtooth or sinusoidal waveform.

Another advantage of utilizing a high frequency line driver as a source for control system 30 is that the waveform of the detection signal at 36 retains its original waveform notwithstanding the relatively small coupling capacitance between conductive elements 16a and 16b. Thus, the tendency of prior art systems to distort the waveform of the detection signal by coupling the higher frequency primary component to a noticeably greater extent than the lower frequency components of the square wave is reduced because all frequency components are at or greater than the primary frequency, which is at a high frequency. This provides a more efficient coupling which is desirable to offset the effects of the greater thickness of substrate 12. Furthermore, the output of peak detector 38, at 40, exhibits a relatively flat amplitude for both the attenuated and non-attenuated conditions of detection signal at 36. This improves the reliability of the system by increasing the distinction between touched and non-touched conditions of touch pad 14. Furthermore, in contrast to prior systems in which the detection signal at 36 is amplified prior to decoding, peak detector 38 is coupled directly with the detection signal at 36. Because, in the illustrated embodiment, peak detector 38 has a low gain, the gain/bandwidth product of the system accommodates the very high frequency of line driver 32 without distortion of the signal. The gain/bandwidth product, as is well understood to those skilled in the art, is a constant for each system and dictates that the frequency band multiplied by the gain of each amplifier cannot exceed a predefined constant without distorting the signal. The output 40 of peak detector 38, in contrast, is a relatively low frequency signal having a significant DC component. Accordingly, desirable amplification can be applied to output 40 by amplitude-responsive switch 42 without compromising the gain/bandwidth product of the system. In addition, the output 40 of peak detector 38 has a limited amplitude range. Therefore, components utilized in peak detector 38 are not required to have a high slew-rate capability, which reduces the expense of such components.

Although control system 30 has been described as it applies to an individual touch pad 14, the same principles are applicable to a keypad 15 composed of multiple touch pads 14 wherein known multiplexing techniques are utilized to apply high frequency line driver 32 and peak detector 38 sequentially to touch pads 14a, 14b . . . 14n in a strobed fashion. Such a system is illustrated in FIG. 5 in which a 250 kHz pulsed signal generator 46 has an output 47 that is applied to a demultiplexing circuit 48. Under the control of an output line 49 of a microcomputer 50, demultiplexer 48 sequentially applies the output of signal generator 46 to driver lines 52a, 52b and 52c. Because of the sequential nature of the application of the drive signal to the drive lines, the drive signal appears as a burst of high frequency pulses on each of the drive lines 52a–52c. The pulse bursts, in turn, produce detection signals on sense lines 54a–54d, which are connected to different groups of touch pads 14a–14n than the pads connected to driver lines 52a–52c. The sense lines 54a–54d are provided as inputs to a multiplex circuit 56, which is under the control of microcomputer 50, via line 55, in order to synchronize multiplex circuit 56 with the operation of the demultiplex circuit 48. Because multiplex circuit 56 is a switching device, which sequentially applies each sense line 54a–54d to detection signal line 57 connected with peak detector 38, the peak detector is directly coupled sequentially with each of the sense lines 54a–54d.

Peak detector 38, in the illustrated embodiment, is composed of an operational amplifier 58 whose output 59 is connected by a diode 60 with its inverting input 61. Diode 60 is also connected, through a resistor 63, with output 40. Detection signal line 57 is connected with the non-inverting input of amplifier 58. Detection signal line 57 is additionally connected to signal ground through a pull-down resistor 62. This configuration is a low gain peak detector because the direct connection feedback provides amplifier 58 with a unity gain. Alternatively, diode 60 could be replaced with a short circuit and a diode connected between output 59 and resistor 63. Output 40 is filtered by a filter 64 in order to complete the peak detect function of peak detector 38. Filter 64 is composed of a parallel combination of resistor 66 and capacitor 68 connected between output 40 and signal ground.

In the illustrated embodiment, pull-down resistor 62 is a 10 kohm resistor. This provides very low input impedance to peak detector 38 which, advantageously, imparts exceptional static electricity resistance to touch control 10. Static charges applied to substrate 12 are rapidly dissipated through resistor 62. This low input impedance is possible because of the exceptional signal strength of the detection signal as a result of the very high frequency primary component of the drive signal, as well as the equivalent resistance/capacitance value (RC) of this portion of the circuit.

Output 40 is provided to the non-inverting input of an amplifier 70. A biasing network composed of resistors 72a and 72b connected in a conventional fashion between an inverting input of amplifier 70 and its output 88 establishes the gain of amplifier 70. As previously described, because the signal on output 40 of peak detector 38 has a relatively low frequency content, the gain of amplifier 70 may be set at a relatively high level without exceeding the gain/bandwidth product of the system and without creating high slew rates. In the illustrated embodiment, the voltage gain of amplifier 70 is between 80 and 100.

In order to detect the capacitance of a user contacting one of the touch pads 14a–14n, output 88 of amplifier 70 is applied to an amplitude-responsive switching circuit, which in the illustrated embodiment is a successive approximation register 74 controlled with microcomputer 50. Successive approximation register (SAR) 74 provides a highly accurate means to allow microcomputer 50 to determine relative amplitude of output 88 of amplifier 70. SAR 74 includes a resistance network 76, which is composed of a ladder of resistances which vary from each other in multiples of two. Therefore, such network is referred to as an R2R network. The R2R network 76 is utilized by microcomputer 50 in order to produce an analog signal at 78 as a function of the combination of output lines 75 actuated by the microcomputer. The analog signal at 78 is scaled by an amplifier 80 whose scaling factor is established by bias resistors 82a and 82b connected in conventional fashion with respect to its output 84 and inverting input. Output 84 is connected with the inverting input of a comparator 86 whose non-inverting input is connected with output 88. The output of 90 of comparator 86 is provided as an input to microcomputer 50.

SAR 74 operates as follows. In order to determine the relative analog voltage at output 88, microcomputer 50 actuates a combination of output lines 75 representative of a known relative analog voltage at output 84 of scaling amplifier 80. Comparator 86 will compare this analog voltage at 84 with the analog voltage at output 88 of amplifier 70. Output 90 of comparator 86 will assume one of two alternate states depending upon whether the approximate voltage produced at output 84 is greater than, or less than, the output voltage 88 of amplifier 70. Microcomputer 50 interprets the state of output 90 in order to adjust the states of output line 75 and vary the analog voltage at 84 until it is substantially equal to the analog voltage at 88. Microcomputer 50 then makes a determination whether such analog voltage represents a touched or non-touched condition for the associated touch pads 14a–14n. Such determination is made in software resident in microcomputer 50 in the manner disclosed in U.S. Pat. No. 5,189,417 issued to David Caldwell and Nicholas Medendorp for a DETECTION CIRCUIT FOR MATRIX TOUCH PAD, the disclosure of which is hereby incorporated herein by reference, except that relative amplitude is used in circuit 30 to determine a touch/no touch condition rather than relative pulse-width used as in the '417 patent. Microcomputer 50 may then actuate the appropriate elements of indicator 22, power relays or the like at output 44 depending upon the responses programmed within the microcomputer for various combinations of input selections by the user contacting touch pads 14a–14n.

Successive approximation registers (SARs) are well known in the art. The advantage of such an SAR is that it provides a higher resolution detection of the relative analog voltage at output 88 of amplifier 70 than would be possible by coupling output 88 directly to an analog input port of microcomputer 50. However, in certain applications, it may be possible to read the analog level of output 88 of amplifier 70 at an analog input port to microcomputer 50. In the illustrated embodiment, SAR 74 is capable of reading the relative analog voltage level at output 88 to an accuracy of nine bits. In contrast, present commercially available microprocessors that are capable of eight-bit accuracy or greater, in a determination of analog input voltages, are relatively expensive.

The unique principles of the present invention allow the application of touch control technology directly to the unique environment of a large horizontal substrate of the type found in smooth cook tops and the like. The hurdle of the use of a substrate that not only has an exceptionally large thickness but also a modulated rear surface is overcome. Circuit means are provided that provide sufficient signal differentiation to accommodate the dielectric of such substrate. Advantageously, the invention additionally provides exceptional immunity to the splashing of liquids, such as water, on the touch control touch pads. The circuit means also advantageously imparts an exceptionally effective static electricity (ESD) immunity to the system. In addition, the invention provides a means for incorporating a display device which produces clear and crisp images notwithstanding the detrimental effect of the modulated rear surface of the substrate. These features allow the touch control to be applied directly to the substrate defining smooth-top cook top. Thus, the requirement for a physical barrier between the separate substrates defining a cook top and a touch control in prior systems is completely eliminated. This is accomplished in a manner which does not require guard rings or the detrimental operation of shutting down the range whenever liquid is splashed on the touch control. Furthermore, safety is enhanced because the present system does not require the use of a separate substrate which may have a reduced thickness from the cook top pan supporting substrate. Thus, the potential of breakage of such thinner substrate is avoided.

Although the present invention has been described as applied to modulated glass ceramic cook tops, its principles may be used in other applications. For example, the invention may be applied to substrates other than modulated glass ceramic cook tops and may be applied to vertical applications, especially where it is desired to enjoy immunity from the splashing of water and the like. Other changes and modifications in the specifically described embodiment can be carried out without departing from the principles of the present invention, which are intended to be limited only by the scope of the appended claims as interpreted according to the principles of patent law, including the Doctrine of Equivalents.

The embodiments of the invention in which an exclusive property or privilege is claimed are defined as follows:

1. A moisture immune touch control circuit for use with a substrate comprising:

a touch responsive circuit including at least one touch pad which produces a detection signal in the presence of capacitance of a user at said touch pad, wherein said detection signal is substantially immune to the presence of moisture; and a decoding circuit that responds to said detection signal in order to determine the presence of said capacitance of a user, said decoding circuit including a successive approximation register circuit in order to determine an amplitude of said detection signal.

2. The touch control circuit in claim 1 wherein said successive approximation register circuit includes a resistance network driven by a microcomputer to produce an approximation signal and a comparator to compare said detection signal with said approximation signal.

3. The touch control circuit in claim 2 wherein said successive approximation register circuit includes a scaling circuit to scale said approximation signal.

4. The touch control circuit in claim 1 including a carrier supporting and electrically interconnecting components defining said touch responsive circuit and said decoding circuit.

5. The touch control circuit in claim 1 wherein said decoding circuit has an input impedance of less than approximately 10 kohms.

6. The touch control circuit in claim 4 including an indicator mounted to said carrier for displaying outputs of said decoding circuit.

7. The touch control circuit in claim 6 wherein said carrier is a flexible carrier.

8. The touch control circuit in claim 4 wherein said carrier is a flexible carrier.

9. The touch responsive circuit in claim 1 wherein said at least one touch pad includes a pair of electrically conductive elements.

10. The touch responsive circuit in claim 9 including a signal generator for applying a signal to one of said elements, the capacitance of a user coupling said signal to the other of said elements as said detection signal.

11. The touch responsive circuit in claim 7 including an adhesive for affixing said flexible carrier to a substrate.

12. A moisture immune touch control circuit which is static electricity resistant for use with a substrate comprising:

a touch responsive circuit including at least one touch pad which produces a detection signal in the presence of capacitance of a user at said touch pad, wherein said detection signal is substantially immune to the presence of moisture; and a decoding circuit the responds to said detection signal in order to determine the presence of said capacitance of a user, said decoding circuit comprising a low gain detector circuit, an amplifier and an impedance element, said detector circuit having an input coupled with said touch responsive circuit to receive said detection signal and an output coupled with said amplifier, said impedance element connected between said input and a ground providing an input impedance for said decoding circuit of less than approximately 10 kohms.

13. The touch control circuit in claim 12 including a carrier supporting and electrically interconnecting components defining said touch responsive circuit and said decoding circuit.

14. The touch control circuit in claim 13 including an indicator mounted to said carrier for displaying outputs of said decoding circuit.

15. The touch control circuit in claim 14 wherein said carrier is a flexible carrier.

16. The touch control circuit in claim 13 wherein said carrier is a flexible carrier.

17. The touch control circuit in claim 16 including an adhesive for affixing said flexible carrier to a substrate.

18. The touch control circuit in claim 12 wherein said detector circuit is a peak detector circuit.

19. The touch control circuit in claim 18 wherein said peak detector circuit has a substantially unity gain.

20. The touch control circuit in claim 12 wherein said detector circuit has a substantially unity gain.

21. The touch control circuit in claim 12 wherein said impedance element has an impedance value of less than approximately 10 kohms.

22. A touch control circuit for use with a substrate comprising:

a touch responsive circuit including at least one touch pad which produces a detection signal in the presence of capacitance of a user at said touch pad; and a microcomputer having an output which operates a resistance network in order to produce an analog signal, a comparator which compares said analog signal with said detection signal and produces a digital signal which is supplied as an input to said microcomputer, said digital signal having a state which is a function of the relative amplitudes of said analog signal and said detection signal, wherein said microcomputer is programmed to adjust said output while monitoring said input in a manner which determines whether said detection signal represents the presence of capacitance of a user at said touch pad.

23. The touch control circuit in claim 22 wherein said decoding circuit has an input impedance of less than approximately 10 kohms.

24. The touch control circuit in claim 22 including a carrier supporting and electrically interconnecting components defining said touch control circuit.

25. The touch control circuit in claim 24 including an indicator mounted to said carrier for displaying outputs of said decoding circuit.

26. The touch control circuit in claim 25 wherein said carrier is a flexible carrier.

27. The touch control circuit in claim 24 wherein said carrier is a flexible carrier.

28. The touch control circuit in claim 27 including an adhesive for affixing said flexible carrier to a substrate.

29. The touch control circuit in claim 22 wherein said at least one touch pad includes a pair of electrically conductive elements.

30. The touch control circuit in claim 29 including a signal generator for applying a signal to one of said elements, the capacitance of a user coupling said signal to the other of said elements as said detection signal.

* * * * *